United States Patent [19]

Hubacher

[11] Patent Number: 5,554,940
[45] Date of Patent: Sep. 10, 1996

[54] BUMPED SEMICONDUCTOR DEVICE AND METHOD FOR PROBING THE SAME

[75] Inventor: Eric M. Hubacher, Austin, Tex.

[73] Assignee: Motorola, Inc., Schaumburg, Ill.

[21] Appl. No.: 270,880

[22] Filed: Jul. 5, 1994

[51] Int. Cl.$^6$ ................................................. G01R 31/26
[52] U.S. Cl. ........................................ 324/765; 324/158.1
[58] Field of Search ................................... 437/183, 209;
324/765, 754, 158.1

[56] References Cited

U.S. PATENT DOCUMENTS

| | | | |
|---|---|---|---|
| 3,795,973 | 3/1974 | Calhoun | 437/8 |
| 5,008,727 | 4/1991 | Katsura et al. | 371/22.6 |
| 5,089,772 | 2/1992 | Hatada et al. | 324/754 |
| 5,187,020 | 2/1993 | Kwon et al. | 324/757 |
| 5,241,266 | 8/1993 | Ahmad et al. | 324/158.1 |
| 5,307,010 | 4/1994 | Chiu | 324/158.1 |

FOREIGN PATENT DOCUMENTS

| | | |
|---|---|---|
| 57-133651 | 8/1982 | Japan . |
| 59-228730 | 12/1984 | Japan . |
| 63-249346 | 10/1988 | Japan . |
| 1-295444 | 11/1989 | Japan . |
| 3-82129 | 4/1991 | Japan . |

OTHER PUBLICATIONS

"Motorola C4 Product Design Manual;" vol. 1: Chip and Wafer Design; ch. 1 (Tech. Overview), pp. 1–1–1–20, and ch. 9 (Wafer Probling), pp. 9–1–9–14 (1993). (month unavailable).

Primary Examiner—Ernest F. Karlsen
Assistant Examiner—Russell M. Kobert
Attorney, Agent, or Firm—Patricia S. Goddard

[57] ABSTRACT

Probing array bumped semiconductor devices using cantilever probe needles is facilitated by the formation of peripheral test pads. A semiconductor die (10) includes bond pads (12). A redistribution metallization layer is deposited and patterned to form individual redistribution structures (26) associated with and electrically coupled to each bond pad. Each redistribution structure includes a test pad (28), a bump pad (30) and a bump pad interconnect (32). The test pads are formed in positions close to those of the underlying bond pads, while the bump pads can be formed anywhere within the die. Having the test pads located similarly to the bond pads enables the same or a similar probe card apparatus and cantilever needles (50) to probe the die either at the bond pads for devices which are to be wire bonded or TAB bonded, or at the test pads for devices which are to be bumped.

19 Claims, 5 Drawing Sheets

BUMPED SEMICONDUCTOR DEVICE AND METHOD FOR PROBING THE SAME

CROSS-REFERENCE TO RELATED APPLICATION

The present invention relates to a commonly assigned, patent application by Thomas F. Lum entitled, "Method for Probing a Bumped Semiconductor Wafer," Serial No. 08/236,847, filed May 2, 1994, now pending.

FIELD OF THE INVENTION

The present invention relates generally to semiconductor devices, and more specifically to bumped semiconductor devices and methods for probing the same.

BACKGROUND OF THE INVENTION

Flip-chip semiconductor devices, such as those using Controlled Collapse Chip Connection (C4) or other bump technologies, have the advantage of establishing a high input/output (I/O) count. A large number of I/Os can be formed on a flip-chip device because traditional peripheral spacing limitations of wire bonded and TAB (tape automated bonding) devices are eliminated. Not only can the number of I/Os increase on a flip-chip device, but the actual space that the device takes up on a user substrate is reduced since conventional packaging elements and materials are not necessary. A further advantage which semiconductor manufacturers have realized is that a C4 or other bump configuration can be established on a product without significant changes to existing semiconductor die designs for flip-chip applications. For example, an existing product which is available in a wire bonded or a TAB bonded configuration can be transformed into a C4 configuration with only back-end manufacturing changes, specifically with the addition of a redistribution metallization process. Die fabrication up to the point of forming bond pads on the semiconductor die is identical between products which will be offered in a C4 configuration and those that will be offered in a wire bonded or TAB bonded configuration. After bond pads are formed, wire bonded and TAB bonded devices proceed to final passivation, while C4 devices undergo the redistribution metallization process. The redistribution metallization process involves depositing an additional metal layer, patterning that metal layer to form interconnects which connect the bond pads to patterned C4 bump pads. In other words, the redistribution metallization layer is used to redistribute the peripheral bond pad configuration into a C4 array or partial array pad configuration. After the redistribution metallization is patterned, final passivation is deposited, and etched to leave access to the C4 bump pads. A barrier metal or series of metals may then be deposited onto the C4 bump pads through a shadow mask. After any barrier metal is deposited, solder is deposited through the same mask to form solder bumps on each of the C4 pads.

While the ability to use the same die design in both C4 configurations and wire bonded or TAB bonded configurations is advantageous from a die manufacturing point of view, there are disadvantages associated with the ability to probe the bumped semiconductor die. After die fabrication is complete, semiconductor wafers are probed to test the functionality of the individual die on the wafer. In wire bonded and TAB bonded devices wherein bond pads are peripherally located around the semiconductor die perimeter, probing is accomplished using a probe card having cantilever probe needles arranged to match the bond pad configuration. With flip-chip or C4 devices where there are solder bonds formed on the pads which are in an array configuration or partial array configuration, there are several problems associated with the wafer probing operation. One problem is that bond pads may not be available for contacting with the probe needle. For instance, a C4 bump may be formed directly or partially over a bond pad so that in order to probe that particular pad the cantilever needle must probe the actual C4 bump. This may lead to mechanical damage of the C4 bump, thereby degrading the integrity of the device as a whole. Another problem in using cantilever probes in conjunction with flip-chip or C4 devices is that the C4 bumps are typically not arranged in a peripheral configuration. Rather, the C4 bumps are arranged in an array configuration where individual C4 bumps may be located several rows deep from the perimeter of the die. In such instances, it is very difficult and sometimes impossible to maneuver cantilever probe needles to such internal C4 bumps without interfering with other probe needles.

A known procedure for probing C4 devices which is simple and inexpensive is to form the C4 bumps and redistribution metal layer such that the peripheral bond pads remain accessible to probe needles. However, this solution is limited to instances where no C4 bumps are formed directly over bond pads. C4 bumps are often formed directly over bumps to minimize interconnect distance, thereby improving device performance or to provide more area on the die to place the bumps.

Another solution to the aforementioned problems associated with probing bumped semiconductor wafers is the use of an array probe. In place of a probe card using cantilever probe needles, an array probe utilizes a probe card having a space transformer. The array probe is used as a replacement to the cantilever probe needles and consists of a plurality of conductive wires or conductive bumps which are electrically connected to a probe card. A significant disadvantage of array probes, however, is that these probes are extremely expensive, and the lead time for developing an array probe for a new product is extremely long.

SUMMARY OF THE INVENTION

In a number of cases, the foregoing disadvantages are overcome and other advantages are achieved with the present invention. In one form, a semiconductor device includes a semiconductor die having integrated circuitry. A bond pad of the die is electrically connected to the integrated circuitry. An insulating layer overlying the bond pad includes an opening which exposes a portion of the bond pad. A metal contact is formed in the opening, making electrical connection to the bond pad. Overlying the insulating layer is a test pad, a bump pad, and a metal interconnect. The test pad is electrically connected to the metal contact, while the metal interconnect electrically connects the bump pad to the test pad. In another form of the invention, such a device is probed by probing the test pad.

DETAILED DESCRIPTION OF A PREFERRED EMBODIMENT

The present invention enables bumped semiconductor die to be probed using conventional cantilever probe needles arranged in a peripheral configuration. In accordance with the present invention, a peripheral bond pad configuration is transformed into a C4 array configuration while maintaining peripheral testing capability. This may be achieved by forming peripheral bond pads on a semiconductor die so that the die may be used for those devices which are to be configured into a wire bond or TAB bond configuration, while also being able to be used for C4 devices. For those devices which are to be bumped (e.g. C4 devices), additional processing involves depositing an insulating layer over the die and the bond pads, and forming vias in the insulating layer to expose a portion of each bond pad. A redistribution metallization layer is then deposited and patterned over the insulating layer. The patterning creates a redistribution structure associated with each underlying bond pad. Each redistribution structure includes a test pad which is electrically connected through the via to an underlying bond pad, a C4 bump pad, and an interconnect portion which connects the test pad to the C4 bump pad. The test pad associated with each bond pad is formed such that it is positioned at or near the same position as the underlying bond pad, although above it. As a result, all the test pads of the device are in a peripheral configuration much like the underlying bond pad configuration. On the other hand, the C4 bumped pads are formed in an array configuration displaced from the die periphery. The test pad of each bond pad is connected to a corresponding C4 bump pad through a metal interconnect portion. Because the test pads are formed with the same metallization layer as that used to form necessary C4 bumped pads, no additional processing steps are necessary in practicing the present invention as compared to conventional processes used to form C4 devices. Another significant advantage of the present invention is that not only can cantilever probe needles in a peripheral configuration be used to probe the semiconductor die, but in many cases the same probe card and cantilever probe configuration used to probe wire bonded or TAB bonded die with peripheral bond pads can be used to probe the peripherally located test pads with only a small modification of a bumped semiconductor die in accordance with the present invention.

These and other features and advantages will be more clearly understood from the following detailed description taken in conjunction with the accompanying drawings. It is important to point out that the illustrations may not necessarily be drawn to scale, and that there may be other embodiments of the present invention which are not specifically illustrated. Throughout the various figures, like reference numerals may be used to designate corresponding parts, but these parts may or may not be identical.

Figure 1:
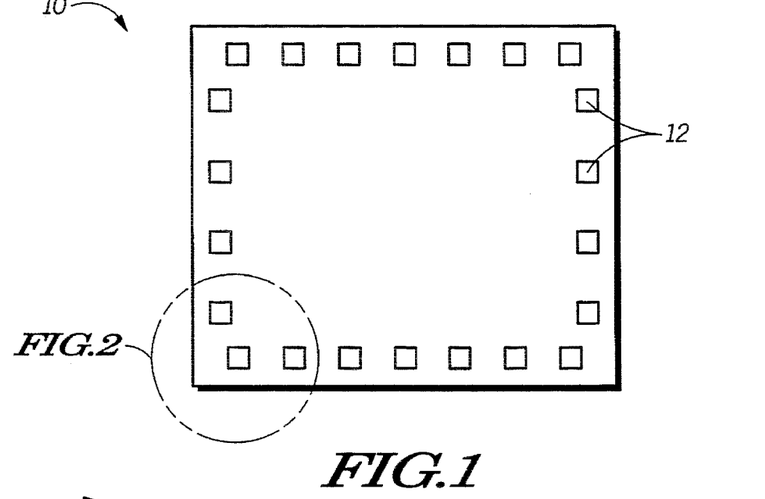
FIG. 1 is a top down view of a semiconductor die at an intermediate stage of fabrication in accordance with the present invention.

FIG. I is a top down view of a semiconductor die 10 which has been fabricated to include integrated circuitry (not shown) and a plurality of bond pads 12 located about the periphery of the die. Bond pads 12 are electrically connected to the integrated circuitry by conventional means, for example, through a series of metal interconnects, contacts, and interlayer dielectric layers (none of which are illustrated). The integrated circuitry of die 10 is not important for understanding the purposes and functions of the present invention, and accordingly will not be described in detail. However, it should be understood that the present invention is applicable for use with all types of integrated circuitry, including, but not limited to, circuitry used in microprocessors, memory devices, digital signal processors, analog devices, and the like.

Figure 2:
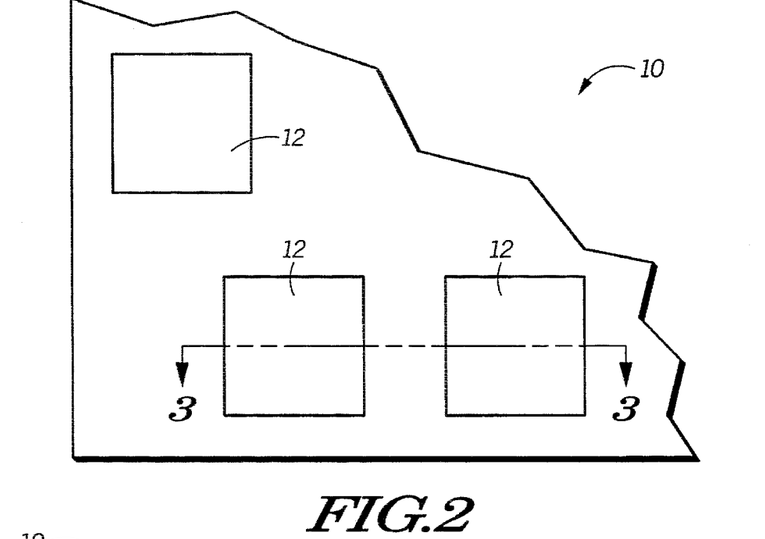
FIG. 2 is an exploded view of a corner portion of FIG. 1.
Figure 3:
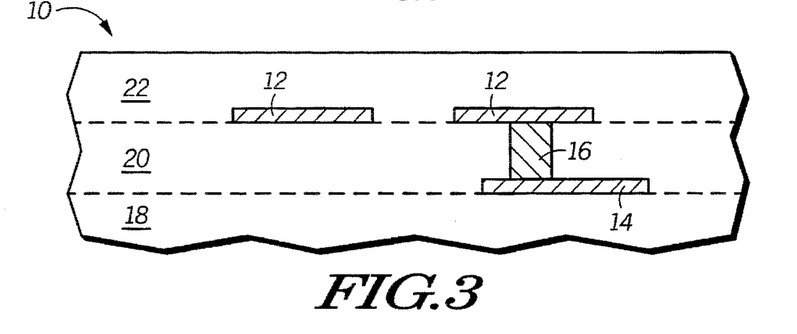
FIG. 3 is a cross-sectional view of a portion of the die illustrated in FIG. 2 taken along the line 3—3.

FIG. 2 is an exploded view of a corner portion of die 10. Much of the remaining description on die processing to form a device in accordance with the present invention will focus only on this corner portion; however, similar processing and results will occur on remaining portions of the die throughout fabrication. The processing steps are described and illustrated in reference to two different figures for each step. A first figure is a top down view of the corner portion of the die as it is processed, while a subsequent figure will show a cross-sectional view of the die following the same step. For example, FIG. 2 is a top down view of the corner portion of die 10 at a stage in fabrication following bond pad formation, while FIG. 3 is a cross-section taken along the line 3—3 of FIG. 2 illustrating the die at the same stage in processing. FIGS. 4 and 5, FIGS. 6 and 7, FIGS. 8 and 9 and FIGS. 10 and 11 have similar relationships.

As shown in FIG. 2, bond pads 12 are formed on die 10, and may be formed using conventional methods. For example, the bond pads may be formed of traditional aluminum or aluminum alloy metallurgies, and may have geometries such as those used in conventional wire bonded and TAB bonded devices. FIG. 3 illustrates how bond pads 12 may be electrically connected to other portions of die 10. A bond pad 12 is electrically connected to a metal interconnect 14 by a metal contact 16. Interconnect 14 is routed internally through die 10 to make the appropriate connection to the actual circuits. In order to form the bond pads, interconnect, and contact, it is necessary to have a series of insulating layers in the device, for example interlayer dielectrics 18 and 20. Interlayer dielectrics are commonly used in semiconductor devices, and may be made from such materials as silicon dioxide, PSG (Phospho-Silicate Glass), BPSG (Boron-Doped PSG), TEOS (tetraethyl-ortho-silicate), and the like. Materials for interconnect 14 an and contact 16 may include aluminum, tungsten, titanium, copper, or other metal used in semiconductor processing. It should be noted that as illustrated in FIG. 3, die 10 is incomplete in that active devices and the semiconducting substrate of the die are not illustrated; however, these aspects of die 10 are not important to understanding the present invention, and furthermore are well understood within the art.

In accordance with the present invention, and as FIG. 3 also illustrates, bond pads 12 are subsequently covered by an insulating layer 22. Insulating layer 22 may be formed of similar materials as those used to form interlayer dielectric layers 18 and 20. Although insulating layer 22 essentially functions as an interlayer dielectric between two metal layers (as will become evident below) is not referred to as "an interlayer dielectric" simply to avoid confusion with underlying insulating layers beneath the bond pad metallization.

Figure 4:
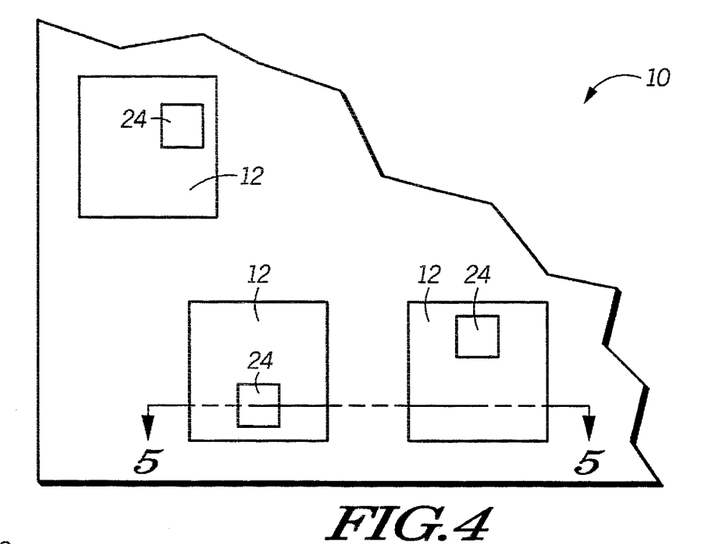
FIG. 4 illustrates the portion of the die shown in FIG. 2 after vias have been formed.
Figure 5:
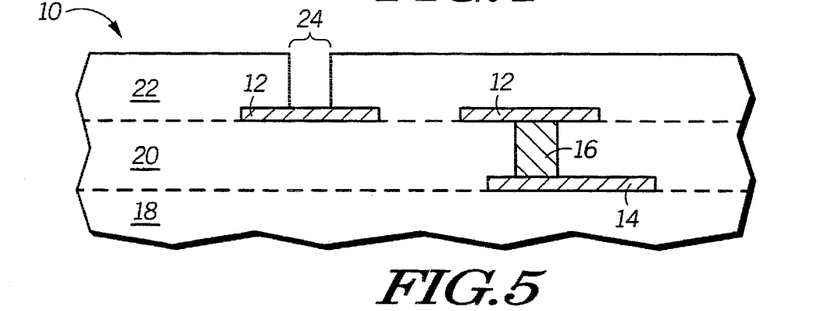
FIG. 5 is a cross-sectional view of the portion of the die illustrated in FIG. 4 taken along the line 5—5.

FIGS. 4 and 5 demonstrate the next processing step, wherein a plurality of vias 24 are formed in insulating layer 22 such that each bond pad 12 has a via associated therewith. Vias may be formed using conventional lithographic and etch techniques. For instance, a photoresist mask can be created which protects all portions of insulting layer 22 except where vias 24 are to be formed. A dry or wet etch may then be used to remove the insulating layer within open portions in the mask, thereby creating vias in the insulating layer which expose underlying bond pads 12. The particular location of vias 24 with respect to the underlying bond pad is not particularly important, although it is advisable to have the entire via located within the boundaries of the bond pad as illustrated in FIG. 4. FIG. 5 is a cross-sectional view of die 10 taken along the line 5—5 of FIG. 4, and demonstrates how vias 24 expose underlying bond pads.

Figure 6:
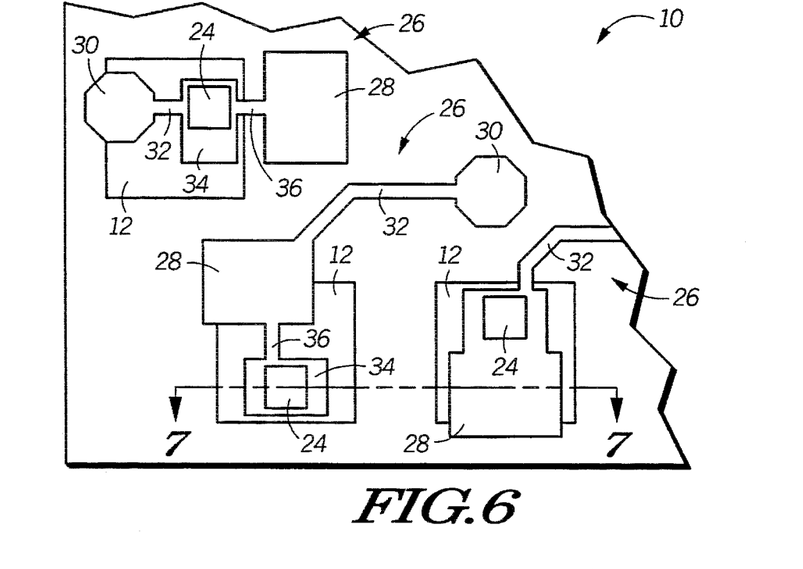
FIG. 6 is a portion of the die illustrated in FIG. 4 after redistribution metallization has been patterned in accordance with the present invention.
Figure 7:
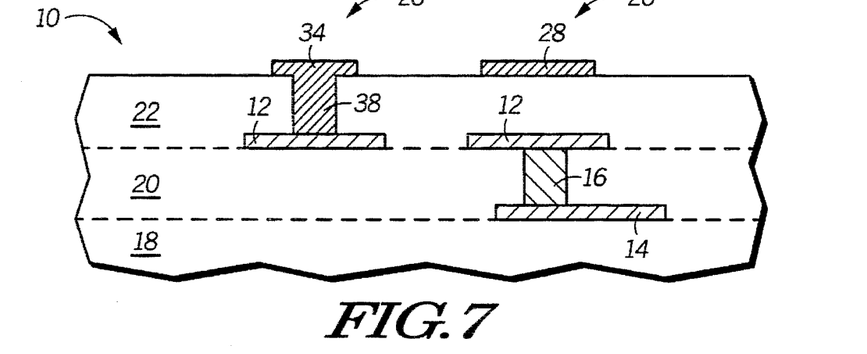
FIG. 7 is a cross-sectional view of the portion of the die illustrated in FIG. 6 taken along the line 7—7.

After formation of vias 24, a redistribution metal layer is deposited over insulating layer 22 and into vias 24 to establish electrical connection to the bond pads. In a preferred embodiment, the metal layer deposited over insulating layer 22 is of the same material used to form bond pads 12, for example aluminum or an aluminum alloy, although other metals are also suitable. Conventional deposition techniques, such as sputtering, chemical vapor deposition, or the like may be used to deposit this metal layer. The metal layer is subsequently patterned to form a plurality of redistribution structures 26, wherein an individual redistribution structure is formed to correspond with each underlying bond pad. FIGS. 6 and 7 illustrate redistribution structures 26 formed as a result of patterning the redistribution metallization layer. As FIG. 6 illustrates, each redistribution structure 26 is a continuous conductive element having at least three individual components: a test pad 28, a bump pad 30, and a bump pad interconnect 32 which electrically connects each test pad to its corresponding bump pad. As FIG. 6 also illustrates, a redistribution structure may also include a via pad 34 and/or a test pad interconnect 36 which are used to electrically connect a test pad 28 to an underlying bond pad 12. Via pad 34 and test pad interconnect 36 are not necessary, since the test pad can be directly formed around the via to establish electrical connection to the bond pad.

In accordance with the present invention, test pads 28 are formed in positions similar to those of the underlying bond pads. Ideally, the test pad positions are as close to the bond pad positions as possible so that the same probe card and cantilever probe needle configuration can be used to probe both wire bonded or TAB bonded devices as well as C4 or bumped devices. The position of bump pads 30 is unrestricted with the exception of design and layout rules a manufacturer might impose upon itself. However, it is noted that the bump should lie sufficiently spaced from the test pad in order to avoid interference with the probe when contacting the test pad (as will subsequently become apparent below). The bump pad 30 may be formed directly overlying a bond pad 12 (as illustrated in the upper left portion of FIG. 6), or a bump pad may be formed closer to the center of die 10 (as also illustrated in FIG. 6). Advantages for forming bump pads 30 as close to the bond pads and test pads as possible is to reduce or minimize the length of the bump pad interconnect 32, thereby enhancing performance of the device. It is also important to note, however, that the bump should be sufficiently spaced from the test pad in order to avoid interference with a probe needle when contacting the test pad during programming. As FIG. 6 also illustrates, the size of test pads 28 need not be identical to those of underlying bond pads 12. The size of test pads 28 should be sufficiently large to enable adequate probing of the pads, but need not be as large as bond pads 12 since a wire bond or TAB bond will not be formed to the test pad. As an example, a typical bond pad 12 may be on the order of 5 mils (0.125 mm) square, while a test pad in accordance with an embodiment of the present invention may be on the order of 3.6 to 4.0 mils (0.09–0.10 mm) square. Note that bump pads 30 are patterned to be hexagonal. This shape is conventional, and facilitates the formation of conductive bumps on the pad at a subsequent stage in processing as will be discussed later.

FIG. 7 demonstrates that upon deposition of the redistribution metallization layer, via 24 is filled with the metal, thereby forming a contact 38 to the underlying bond pad 12. This contact is an integral and continuous portion of via pad 34, as illustrated in FIG. 7, but may instead be an integral part of a test pad or other portion of the redistribution structure. Furthermore, contacts 38 to underlying bond pads 12 may be formed from a metal or conductive material separate from that which is used to form the redistribution structures. For instance, contacts 38 may be tungsten plugs or copper plugs, while the redistribution structures are formed from a different metal. All that is required is that electrical connection is established between each redistribution structure and its associated underlying bond pad.

Figure 8:
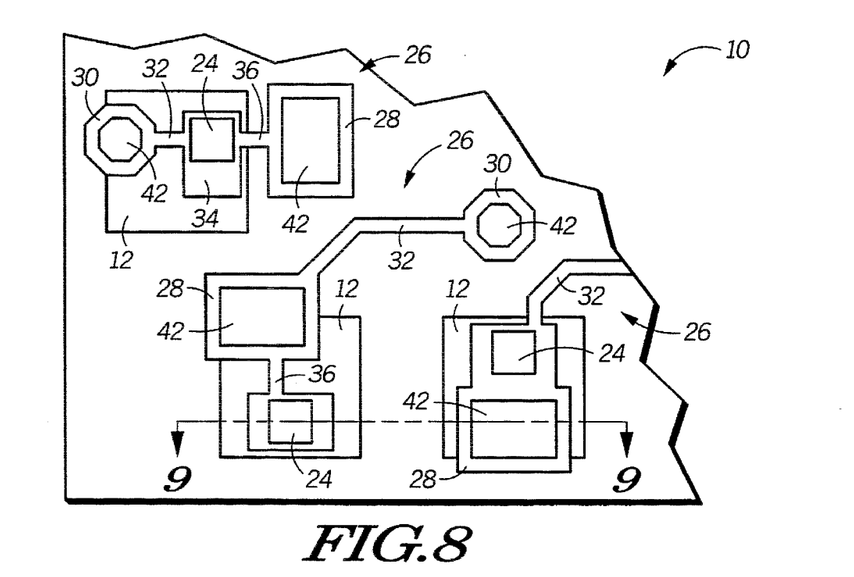
FIG. 8 is a top view of the portion of the die illustrated in FIG. 6 after final passivation and passivation openings are formed.
Figure 9:
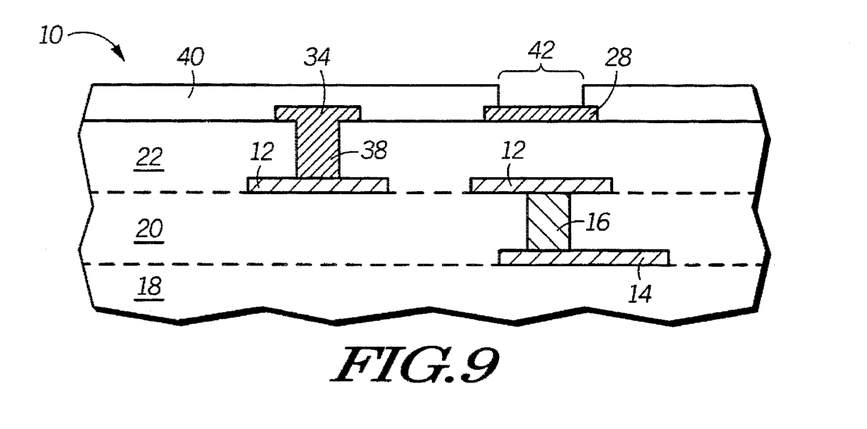
FIG. 9 is a cross-sectional view of the portion of the die illustrated in FIG. 8 taken along the line 9—9.

Following formation of the individual redistribution structures, a final passivation layer is deposited over die 10, much like that which is done on wire bonded or TAB bonded devices. For example, the passivation material may be a composition of silicon-nitride, silicon-oxide-nitride, polyimide, or a combination of these materials. To enable electrical access to the integrated circuitry of die 10, openings must be formed in the passivation layer to expose portions of the redistribution structures. As FIGS. 8 and 9 illustrate, a passivation layer 40 is deposited over die 10. The passivation layer covers the redistribution structures, but a subsequent passivation etch is used to create a plurality of openings 42 in the passivation layer 40. Openings 42 are formed in two regions of each redistribution structure. As illustrated in FIG. 8, an opening 42 is created over test pads 28 and over bump pads 30. No other portions of the redistribution structures are exposed as a result of the passivation etch. The test pads must be exposed to enable electrical connection between probe needles and the test pad, while the bump pads must be exposed to enable electrical connection between subsequently deposited conductive bumps and the underlying pads. FIG. 9, which is a cross-sectional illustration of the die as illustrated in FIG. 8 taken along the line 9—9, demonstrates that openings 42 are formed only over the test pads 28 and bump pads 30, while keeping other portions of the redistribution structures, such as via pad 34, covered and insulated.

Figure 10:
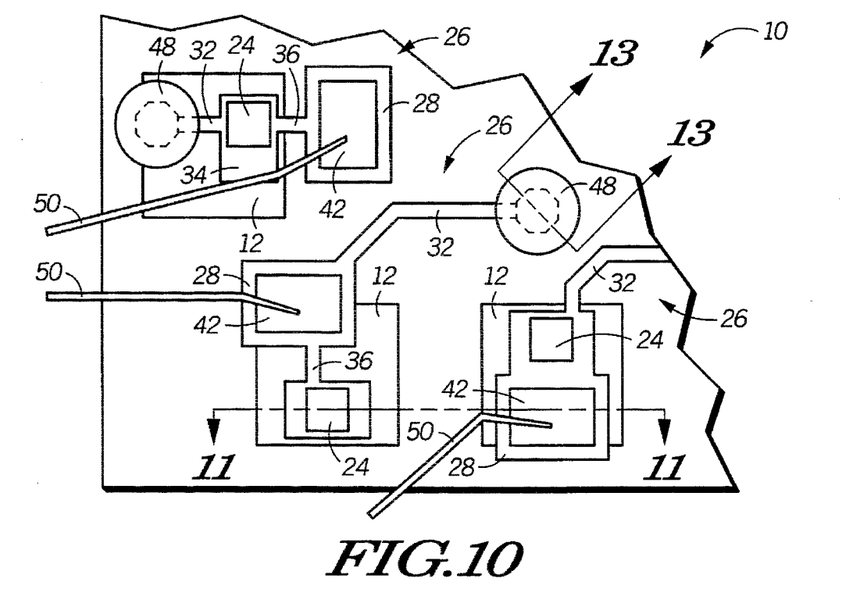
FIG. 10 is a top view of the portion of the die illustrated in FIG. 8 after solder bumps have been formed, and illustrates how cantilever probe needles may be used to probe the die in accordance with the present invention.
Figure 12:
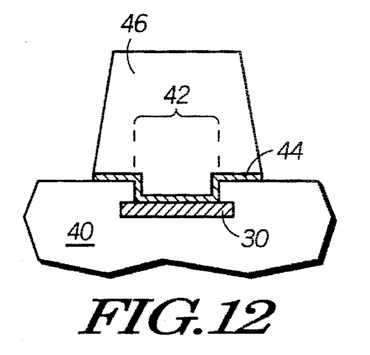
FIGS. 12 and 13 are cross-sectional views of a portion of the die illustrated in FIG. 10 taken along the line 13—13, before and after a reflow operation, respectively.
Figure 13:
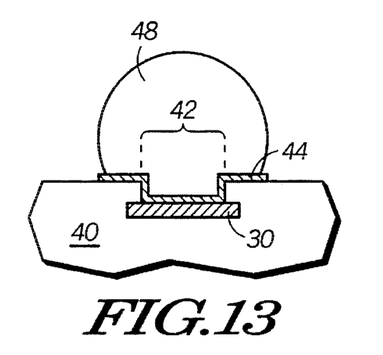

After passivation and passivation openings have been formed, conductive bumps, such as solder bumps, are formed on bump pads 30. As illustrated in FIG. 10, solder bumps 48 are formed on bump pads 30. In accordance with traditional C4 and other bump processes, prior to depositing solder onto the bump pads, a barrier metal or series of metals may be deposited in and around the area of the passivation openings 42 overlying bump pads 30. The purpose of such barrier metals is to improve adhesion of the bumps, lower contact resistance, and inhibit contamination of the redistribution metal. The barrier metals are deposited in a manner similar to the solder deposition used to create the actual conductive bumps. One conventional process involves the use of a shadow mask, wherein a molybdenum or "moly" mask having openings corresponding in location to the bump pads is used as a deposition mask. The mask is placed over the die or wafer, and metal is deposited through the openings in the moly mask. Thus, metal is deposited only over the bump pad areas. The moly mask may be used to deposit barrier metals within the bump pad area, and is also used to deposit solder in the bump pad area. For example, as illustrated in FIGS. 12 and 13, a barrier metal or series of metals 44, such as a combination of chrome, copper, and gold may be formed in and around opening 42 in passivation layer 40. In depositing the barrier metal using moly mask, no etch step is required since the mask results in a selective deposition of the metal in only desired areas. After forming a sufficient thickness of barrier metal, solder 46 is then deposited through the same moly mask, and is therefore likewise selectively deposited in desired areas. As deposited through the moly mask, the solder will take on the shape of a truncated cone, but as a result of a reflow step, capillary forces will transform the pyramid shaped solder element into a solder bump 48, as illustrated in FIG. 13.

Figure 11:
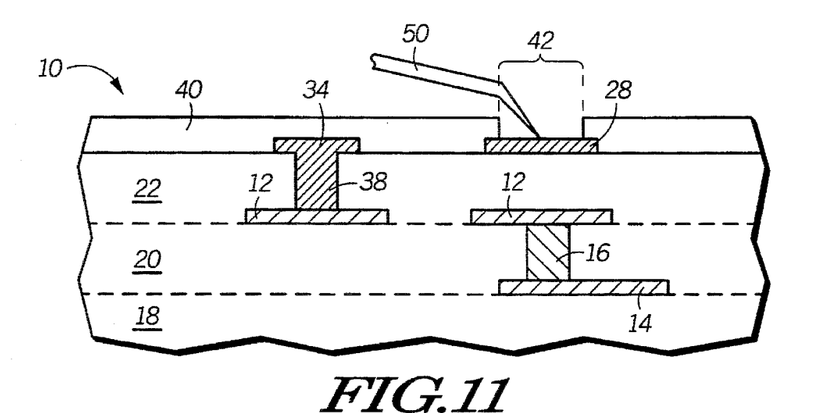
FIG. 11 is a cross-sectional view of the portion of the die illustrated in FIG. 10 taken along the line 11—11.

FIG. 10 also shows a plurality of cantilever probe needles 50 in electrical contact with the three test pads illustrated. Probe needles 50 are like those used in conventional cantilever probing of wire bonded or TAB bonded devices. Although not shown, in probing die 10 it is necessary that probe needles 50 are in some way electrically connected to a probe card and/or a tester, both of which are well known within the art. FIG. 11 is a cross sectional illustration taken along the line 11—11 of FIG. 10, and likewise demonstrates a probe needle 50 electrically contacting a test pad 28 in accordance with the present invention.

Figure 14:
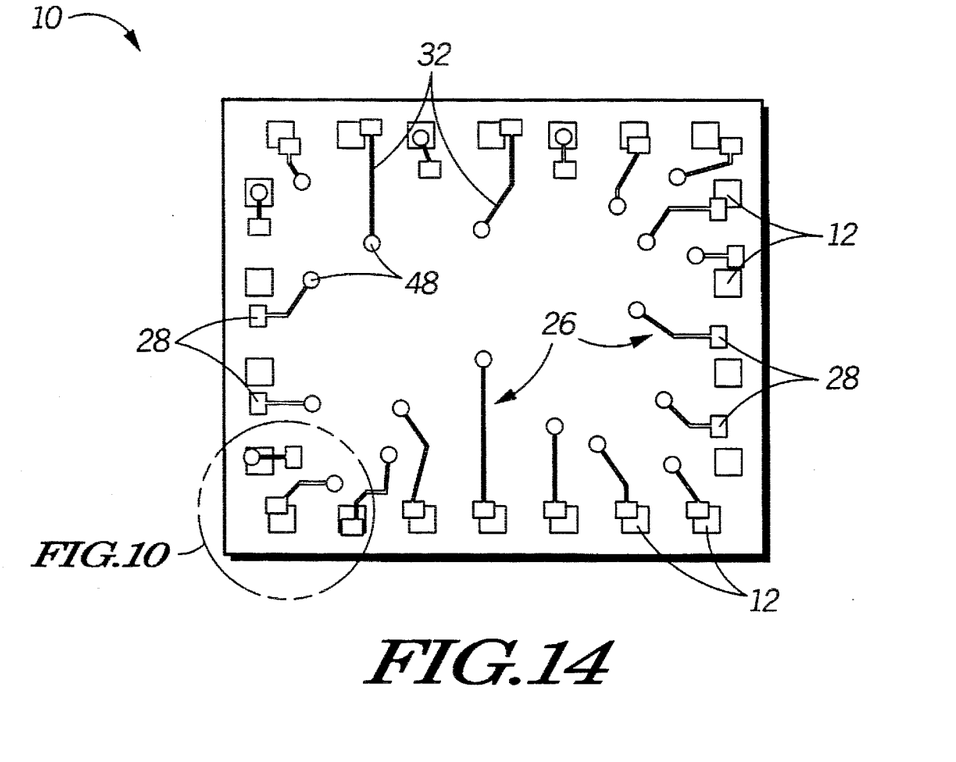
FIG. 14 is a top down view of the die illustrated in FIG. 1 after the processing step illustrated in FIGS. 2–13 have been completed, in accordance with the present invention.

FIG. 14 is a top down illustration of the complete die 10 after the redistribution structures 26 and conductive bumps or solder bumps 48 have been formed thereon in accordance with the present invention. As illustrated in FIG. 14, only bond pads 12, test pads 28, bump pad interconnects 32 and solder bumps 48 are illustrated for the sake of clarity. Although all these elements are illustrated in FIG. 14, it is important to note that not all of these elements exist at the same level or layer within die 10. As is clear from the foregoing description, bond pads 12 underlie the redistribution structures and are separated therefrom by an insulating layer.

FIG. 14 demonstrates many of the advantages of the present invention. As illustrated, test pads 28 are located about the periphery of die 10 and are positioned closely to their corresponding bond pads. This feature enables the same or very similar probe cards and cantilever probe configurations to be used for probing test pads 28 on bumped devices as well as on unbumped devices which will eventually be wire bonded or TAB bonded. In the former, test pads 28 will be probed, while in the latter bond pads 12 will be probed. Thus, the similarity in positions between test pads 28 and bond pads 12 will facilitate using similar testing apparatus. An advantage in using peripheral test pads to probe bumped semiconductor devices is that often conductive bumps which require probing are centrally located and/or are several rows of bumps deep into the die such that probing these internal bumps with conventional cantilever probe needles becomes difficult. Maneuvering the probe needles between adjacent bumps is eliminated with the present invention, by establishing peripheral test pads while maintaining an internal array of conductive bumps.

The foregoing description and illustrations contained herein demonstrate many of the advantages associated with the present invention. In particular it has been revealed that peripheral probing capability can be achieved with centrally located bumps. Moreover, the present invention also permits C4 bumps to be formed directly over conventional bond pads. Because the present invention utilizes test pads which are distinct from bond pads, the formation of conductive bumps directly over bond pads does not impede the ability to test the device. Furthermore, the present invention facilitates universal die design irrespective of the final packaging used for the device. The same die design can be used with both wire bonded or TAB bonded devices and with flip-chip or C4 devices. The only difference between the two device types is that in flip-chip applications, additional processing to form the redistribution structures is required in accordance with the present invention. Another advantage is that formation of the test pads to accomplish the testing as described in accordance with the invention does not require additional processing.

Thus, it is apparent that there has been provided in accordance with the present invention a bumped semiconductor device and method for probing the same that fully meets the needs and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. For example, the present invention is not limited to use with any particular type of semiconductor die or type of integrated circuitry. In addition, the invention is not limited to the specific materials and processing techniques mentioned in the foregoing description. In particular, the invention is not limited to bumped semiconductor device having C4 bumps. The invention is applicable to any type or bumped for flip-chip device. It is also important to note that while emphasis has been placed on the proximity of test pads to underlying bond pad positions, that such proximity is limited only by the ability or inability to use cantilever probe needles to probe the test pads. In preferred embodiments of the present invention, it is anticipated that the maximum displacement between a test pad edge and a bond pad edge will be on the order of less than or equal to 10 mils (0.215 mm). This range of displacement does not include displacement of test pad edges formed within the bond pad boundaries. Therefore, it is intended that this invention encompass all such variations and modification as fall within the scope of the appended claims.

I claim:

1. A semiconductor device comprising:

a semiconductor die having a semiconductor substrate with integrated circuitry formed thereon;

the semiconductor die further comprising:

a first metal layer overlying the semiconductor substrate and patterned to form a plurality of bond pads, the plurality of bond pads being electrically connected to the integrated circuitry;

an insulating layer overlying the first metal layer, the insulating layer having a plurality of openings formed therein such that each opening exposes a portion of an underlying bond pad;

a second metal layer overlying the insulating layer and filling the plurality of openings to form a plurality of contacts to the plurality of bond pads, the second metal layer being patterned to also form a plurality of test pads electrically connected to the plurality of contacts, a plurality of bump pads, and a plurality of interconnects, wherein each test pad is electrically connected to a corresponding one of the plurality of bump pads by one of the plurality of interconnects; and a plurality of conductive bumps formed on the plurality of bump pads.

2. The semiconductor device of claim 1 wherein at least one test pad overlies and at least partially overlaps a corresponding one of the plurality of bond pads.

3. The semiconductor device of claim 1 wherein a first bump pad of the plurality of bump pads is at least partially formed directly over a first bond pad of the plurality of bond pads.

4. The device of claim 1 wherein the plurality of bond pads comprises a first bond pad having an edge, wherein the plurality of test pads comprises a first test pad which corresponds with and overlies the first bond pad, the first test pad having an edge which corresponds with the edge of the first bond pad, and wherein a displacement distance between the edge of the first bond pad and the edge of the first test pad is less than approximately 0.25 mm.

5. The device of claim 1 wherein the semiconductor die has a periphery, and wherein the plurality of bond pads are formed around the periphery of the semiconductor die.

6. The device of claim 5 wherein the plurality of bump pads are formed at least partially in an array configuration within the periphery, and wherein one of the plurality of the bump pads is at least three bump pads deep in the array configuration.

7. The device of claim I wherein the plurality of conductive bumps comprises a plurality of solder bumps.

8. A semiconductor device comprising:

a semiconductor die having integrated circuitry formed thereon;

the semiconductor die further comprising:

a bond pad electrically connected to a portion of the integrated circuitry;

an insulating layer overlying the bond pad;

an opening in the insulating layer which exposes a portion of the bond pad;

a metal contact formed in the opening and making electrical connection to the bond pad;

a test pad formed over the insulating layer and electrically connected to the metal contact;

a bump pad for receiving a conductive bump formed over the insulating layer; and a metal interconnect formed over the insulating layer and electrically connecting the test pad and the bump pad.

9. The device of claim 8 wherein the test pad overlies and at least partially overlaps the bond pad.

10. The device of claim 8 wherein the bump pad overlies and at least partially overlaps the bond pad.

11. The device of claim 8 wherein the semiconductor die has a periphery, wherein the bond pad is formed adjacent the periphery, and wherein the bump pad is positioned farther from the periphery than the bond pad.

12. The device of claim 8 further comprising a conductive solder bump formed on the bump pad.

13. The device of claim 12 further comprising barrier metal formed on the bump pad without being formed on the test pad.

14. The device of claim 8 wherein the bond pad is formed from a first metal layer and the test pad, the bump pad, and the metal interconnect are formed from a second metal layer.

15. A method for probing a semiconductor device comprising the steps of:

providing a semiconductor substrate having integrated circuitry formed thereon within a defined semiconductor die area which is to be tested;

forming a plurality of bond pads overlying the semiconductor substrate within the defined semiconductor die area and electrically connected to the integrated circuitry;

depositing an insulating layer over the plurality of bond pads;

forming a plurality of openings in the insulating layer such that an opening overlies each bond pad to expose a portion thereof;

depositing a metal layer over the insulating layer and into the plurality of openings such that the metal layer is in electrical contact with the plurality of bond pads;

patterning the metal layer to form a redistribution metal structure associated with each bond pad, the redistribution metal structure of each associated bond pad comprising:

a test pad electrically connected to the associated bond pad;

a bump pad; and a metal interconnect which electrically connects the test pad and bump pad; and probing each test pad to test functionality of the integrated circuitry.

16. The method of claim 15 wherein the step of forming a plurality of bond pads comprises forming a plurality of bond pads along a periphery of the defined semiconductor die area, and wherein the step of patterning comprises patterning the metal layer such that each test pad is also formed along the periphery of the defined semiconductor die area.

17. The method of claim 15 wherein the step of probing comprises probing using cantilever probe needles.

18. The method of claim 15 further comprising the step of forming a conductive bump on each bump pad.

19. The method of claim 18 further comprising the step of depositing a barrier metal on each bump pad, prior to forming the conductive bump, and without depositing barrier metal on any test pad.

* * * * *